US006734120B1

(12) United States Patent
Berry et al.

(10) Patent No.: US 6,734,120 B1
(45) Date of Patent: May 11, 2004

(54) METHOD OF PHOTORESIST ASH RESIDUE REMOVAL

(75) Inventors: Ivan Berry, Ellicott City, MD (US); Stuart Rounds, Frederick, MD (US); John Hallock, Potomac, MD (US); Michael Owens, Austin, TX (US); Mahmoud Dahimene, Sunnyvale, CA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 09/505,695

(22) Filed: Feb. 17, 2000

Related U.S. Application Data

(60) Provisional application No. 60/120,866, filed on Feb. 19, 1999.

(51) Int. Cl.$^7$ ............................................. H01L 21/31
(52) U.S. Cl. .................... 438/906; 438/759; 438/963
(58) Field of Search ......................... 438/715, 906, 438/693, 974, 691, 759, 963; 134/1–4

(56) References Cited

U.S. PATENT DOCUMENTS

| | | | | |
|---|---|---|---|---|
| 3,890,176 A | * | 6/1975 | Bolon ........................ 438/708 |
| 4,548,688 A | | 10/1985 | Matthews | |
| 4,778,536 A | * | 10/1988 | Grebinski ..................... 134/36 |
| 4,966,664 A | * | 10/1990 | Buerk et al. ................. 205/705 |
| 5,068,040 A | * | 11/1991 | Jackson ....................... 210/748 |
| 5,223,443 A | * | 6/1993 | Chinn et al. ................... 438/14 |
| 5,236,602 A | * | 8/1993 | Jackson ....................... 210/748 |
| 5,332,444 A | * | 7/1994 | George et al. .................. 134/1 |
| 5,339,844 A | * | 8/1994 | Stanford et al. ............. 134/107 |
| 5,456,759 A | * | 10/1995 | Stanford et al. ................ 134/1 |
| 5,578,133 A | * | 11/1996 | Sugino et al. .................. 134/2 |
| 5,669,979 A | * | 9/1997 | Elliott et al. ................... 134/1 |
| 5,677,113 A | * | 10/1997 | Suzuki et al. ................... 134/1 |
| 5,747,387 A | * | 5/1998 | Koizumi et al. ............ 438/708 |
| 5,814,156 A | | 9/1998 | Elliott et al. | |
| 5,821,175 A | * | 10/1998 | Engelsberg ................. 438/795 |
| 5,911,837 A | * | 6/1999 | Matthews ...................... 134/2 |
| 5,925,577 A | * | 7/1999 | Solis ........................... 438/725 |
| 6,043,165 A | * | 3/2000 | Park et al. ................... 438/759 |
| 6,046,115 A | * | 4/2000 | Molloy et al. .............. 438/710 |
| 6,124,211 A | * | 9/2000 | Butterbaugh et al. ....... 438/708 |
| 6,129,845 A | * | 10/2000 | Kim et al. ................... 210/663 |
| 6,242,165 B1 | * | 6/2001 | Vaartstra ..................... 430/329 |
| 6,251,794 B1 | * | 6/2001 | Peng et al. .................. 438/712 |
| 6,551,409 B1 | * | 4/2003 | DeGendt et al. ............... 134/2 |

FOREIGN PATENT DOCUMENTS

| | | | | |
|---|---|---|---|---|
| JP | 03147322 | | 6/1991 | ......... H01L/21/304 |
| JP | 04010622 | | 1/1992 | ......... H01L/21/304 |
| JP | 0 875 926 A2 | | 4/1998 | ....... H01L/21/3213 |
| JP | 0 875 926 A3 | | 10/1999 | ....... H01L/21/3213 |
| WO | WO 97/11482 | * | 3/1997 | |

OTHER PUBLICATIONS

Silicon Processing for the VLSI Era vol. 1 by S. Wolf and R.N. Tauber, 1986, pp. 429, 452–453, 514–517.*

* cited by examiner

*Primary Examiner*—Long Pham
*Assistant Examiner*—Thao X. Le
(74) *Attorney, Agent, or Firm*—Edell Shapiro & Finnan, LLC; Martin Abramson

(57) ABSTRACT

A method of enabling the removal of fluorine containing residue from a semiconductor substrate comprising applying a gas and/or vapor to which the residue is reactive to the residue while the temperature of the substrate is at an elevated level with respect to ambient temperature and the residue is exposed to ultraviolet radiation, for a time period which is sufficient to effect at least one of volatilizing the residue or rendering the residue hydrophilic enough to be removable with deionized water.

6 Claims, 1 Drawing Sheet

METHOD OF PHOTORESIST ASH RESIDUE REMOVAL

REFERENCE TO RELATED APPLICATION

This application is based on Provisional Application No. 60/120,866, filed Feb. 19, 1999.

FIELD OF THE INVENTION

This invention relates to semiconductor device manufacture, and is directed to an improved method of stripping photoresist, removing residues, or cleaning wafer surface.

BACKGROUND OF THE INVENTION

In the manufacture of integrated circuits, the technique of photolithography is required to form the integrated circuit patterns. In the practice of this technique, a semiconductor wafer is coated with a photoresist. The photoresist is then exposed to ultraviolet radiation which is passed through a mask so that a desired pattern is imaged on the photoresist. This causes changes in the solubility of the exposed areas of the photoresist such that after development in a suitable developer a desired pattern is fixed on the wafer, whereupon the photoresist may hardbaked or photostabilized to enable it to withstand subsequent processing.

After the integrated circuit components are formed, it is generally necessary to remove (strip) the photoresist from the wafer as it has already served its useful purpose. The relative ease or difficulty with which the photoresist may be stripped depends on the degree to which physical and chemical changes have been induced in the photoresist during plasma etching or ion implantation processes and on the degree to which cross-linking has occurred in the photoresist. Thus, it is generally known that a significant degree of hard baking and, to an even greater extent, the processes of plasma etching and ion implantation induce physical and chemical changes in the photoresist, so that stripping is particularly difficult.

It has been found that plasma ashing of the photoresist from a wafer after it has served its purpose frequently results in tenacious fluoride containing residues that cannot be generally removed by oxygen plasmas. These residues are difficult to remove in part because they contain substantial amounts of fluorine containing substance(s) generated during an earlier fluorine based plasma etching step. The residue may be rendered even more resistant to removal by incorporation of sputtered metal or other inorganic materials.

To address this problem, some have employed wet cleaning techniques utilizing e.g., amine-based solvents (see, for example, Wang, Y; Graham, S. W.; Chan, L.; Loong, S. J. Eletrochem. Soc., Vol. 144, No. 4, Apr. 1977). This approach, however, is inherently undesirable as it involves the use of large quantities of hazardous chemicals and necessitates their costly disposal. For a wet cleaning process ultimately a water only rinse would be most acceptable from health and economic perspectives, as probably no disposal costs would be incurred. The hydrophobic nature of the tenacious resist residues, however, renders them unaffected by pure water.

SUMMARY OF THE INVENTION

It is thus an object of the invention to provide an improved method of removing fluorine-containing residues.

In accordance with the present invention, the above object is accomplished by providing an improved method for removing photoresist ash residues in which the residue-contaminated wafers are exposed to a combination of heat, ultraviolet radiation, and a reactive gas and/or vapor. This combined treatment either volatilizes the residue or renders it more hydrophilic, and easier to remove by rinsing with deionized water.

BRIEF DESCRIPTION OF THE DRAWINGS

The invention will be better understood by referring to the accompanying drawings wherein.

DETAILED DESCRIPTION OF INVENTION

As discussed above, stripping of photoresists (and their by-products) may present particular difficulty because of the processing which the wafer has undergone. Photoresist hard baking and photostabilization, as well as plasma etching and ion implantation are illustrative of those processes which induce physical and chemical changes in photoresist, and make it more difficult to strip.

As device dimensions have become smaller, plasma etch recipes have been formulated to increasingly take advantage of sidewall passivation to obtain the desired selectivity and Critical Dimension (CD) control. Typically, this is achieved by using an etch chemistry that allows selective polymer deposition on surfaces where a slower etch rate is desired. For example, to achieve anisotropic etching of $SiO_2$, C, F, H containing gas mixtures may be used. Typically, fluorine is the principal etching component in the plasma. Disassociated $CF_x$(x=1, 2 and 3) molecules are responsible for the formation of fluorine containing deposits on the bottom and vertical sidewalls of the contact or via holes. The competition between deposition and etch is used to control the etch profile. In some cases, toward the end of the process, during the over-etch phase, a nonvolatile metal such as Al from the exposed underlayer may be sputtered from the bottom of the hold and redeposited on the passivated sidewalls. Typically, the result is a metal-inbedded fluorine containing residue which remains in the via hole. Similar schemes are used for metal and polysilicon etch.

Figure 1:
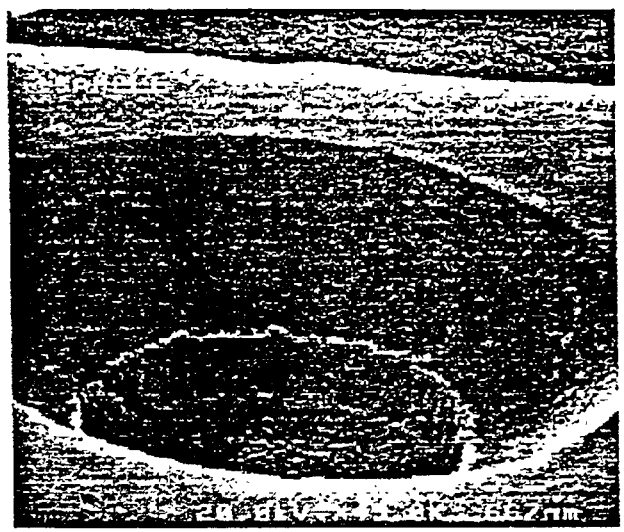
FIG. 1 is a photomicrograph of a wine glass via showing the residue remaining after the performance of an ashing process.

Such residues generally cannot be removed by oxygen plasma. However, directional ion bombardment with fluorine-containing plasma is typically effective in removing them from the bottom of contact or via holes, but not from the sidewalls due to the small angle of incidence. FIG. 1 is a photomicrograph of a "wineglass" via after the top layer polymer has been removed by performing an ashing process by a downstream plasma asher using a fluorine containing gas. It is noted that there is residue remaining on the bottom of the via and on the lower portion of the sidewalls.

In accordance with the present invention, this residue is removed by exposure to a combination of heat, ultraviolet radiation, and a reactive gas and/or vapor. Such reactive gases and vapors include but are not limited to ammonia, amines, sulfur dioxide, sulfur dioxide and oxygen, sulfur trioxide, hydrogen sulfide, carbon dioxide, carbon monoxide, carbon disulfide, carbonyl sulfide, alcohols, thiols, hydrogen peroxide, and water. Preferred treatments include ammonia, hydrazine, and sulfur dioxide. These chemicals may be used in diluted form (i.e., in a inert carrier gas) and/or in mixtures, and at various pressures. More particularly, the preferred pressure range is between 50 Torr and about 1 atmosphere. Frequently, their use in diluted form is sufficient to effect the desired treatment while substantially reducing the hazards associated with accidental exposure to the vapors. At times it may be advantageous to accomplish the treatment under reduced pressures to minimize ultraviolet absorption by the atmosphere between the ultraviolet source and the residues.

In performing a process according to the present invention, the gas may be applied to a substrate while the substance is being irradiated with ultraviolet radiation and is at an elevated temperature. The ultraviolet radiation may be applied so as to blanket the residue; therefore a laser typically is not an appropriate light source. However, various sources, such as high intensity mercury arc lamps, microwave excited plasma lamps, excimer lamps, and other high intensity ultraviolet light sources, which are capable of providing a blanketing irradiation, may be used.

The substance may be heated to an elevated temperature by various means. According to one embodiment, a wafer is situated on a temperature-controlling chuck and irradiated with a source emitting ultraviolet and infrared radiation while applying the reactive gas(es). The infrared radiation will heat the wafer, and the amount of temperature rise will be controlled by the mass of the temperature controlling chuck. Such a system is disclosed is connection with a photostabilizion chamber in U.S. Pat. No. 4,548,688, the contents of which are in their entirety incorporated herein by reference.

The exact nature of the chemical transformations that occur during treatment can depend on the nature of the gas or vapor used, the nature of the resist residue, and the intensity and the duration of exposure to both ultraviolet radiation and heat. In many cases, the polymer residues are quite thermally stable and transparent to all but the lowest wavelength ultraviolet radiation. By using chemical vapors which are themselves thermally or photochemically reactive, however, highly reactive intermediates may be formed which are then capable of interacting with the residue and rendering it more hydrophilic. In the case of hydrazine, it is speculated that $N_2H_3$, $NH_2$, $H$ (atomic hydrogen), and: NH (nitrene) formed by ultraviolet photolysis react with the polymer surface to ultimately incorporate amino groups as well as effecting fluorine replacement by hydrogen. Similarly, ammonia is known to generate $.NH_2$ and $.H$ under ultraviolet irradiation, which can then react in the same way as the hydrazine photolysis products.

This invention may be used with various types of photoresists including but not limited to I-line resists, such as those based on novolac and diazonaphthoguinone resins, deep UV resists, such as those based on partially protected poly(hydroxystyrene) resins or hydroxystyrene./ methacrylate.copolymers, and 193 nm resists, such as those based on methacrylate or cycloolefin resins.

Description of a Specific Process Example

In a specific process, the wafer is processed in a downstream plasma chamber to ash photoresist and partially remove the fluorine containing residues from the via holes. The gases used are $O_2/N_2/H_2/CF_4$ at a pressure of 1.5 Torr with 2000 W of microwave power. After this step, metal-containing residue is left on the bottom of the hole and in the lower region of the sidewalls, as shown in FIG. 1. It is believed that a relatively high concentration of metal which is sputtered from bottom of the hole during over-etch is present.

Figure 2:
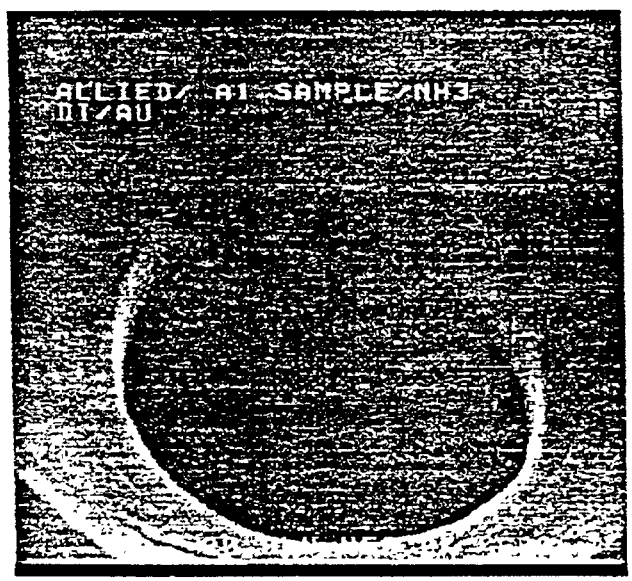
FIG. 2 is a photomicrograph of the same wine glass via as in FIG. 1 after the process of the present invention has been employed.

To remove the remaining residues, the wafer is exposed to ultraviolet radiation in a gas mixture of 5% $NH_3$ and 95% $N_2$ at 760 Torr and 120° C., at a flow rate of 2000 sccm for 60 seconds. The wafer is then rinsed with deionized water to remove residues rendered water-soluble by the $NH_3$-UV. A photostabilizer chamber (Eaton PCU) as previously described may be used to effect the exposure. As is shown in FIG. 2, the wafer is free of residues after the rinse step.

Thus, a process for photoresist residue removal has been described. Inasmuch as variations which do not depart from the spirit and scope of the invention will occur to those skilled in the art, it should be understood that the invention to be covered is defined by the following claims.

What is claimed is:

1. A method of processing a semiconductor wafer comprising the steps of:

coating the wafer with a photoresist;

imaging a pattern on the photoresist with ultraviolet radiation;

developing the photoresist;

hardbaking or stabilizing the photoresist;

forming integrated circuit components on the wafer; and removing the photoresist from the wafer, by
  a) performing an ashing process on the photoresist with a plasma which removes the photoresist except for a residue; and
  b) removing the residue without the use of a laser by applying a gas and/or vapor to which the residue is reactive, and which need not be in supercritical or dense phase form, by
    i) applying said gas and/or vapor to which the residue is reactive to the wafer while the temperature of the wafer is at an elevated level with respect to ambient temperature;
    ii) exposing the wafer to ultraviolet radiation provided by an ultraviolet lamp simultaneous with said gas and/or vapor applying step, wherein the applying and exposing steps are continued for a period of time sufficient to render the residue to be soluble in deionized water; and
    iii) rinsing the substrate with deionized water.

2. The method of claim 1 wherein the gas and/or vapor vapor is comprised of at least one member selected from the group consisting of amines, alcohols, thiols, ammonia, sulfur dioxide, sulfur dioxide and oxygen, sulfur trioxide, hydrogen sulfide, carbon dioxide, carbon monoxide, carbon sulfide, carbonyl sulfide, hydrogen peroxide, and water.

3. The method of claim 2 wherein the gas and/or vapor is applied at a pressure of between 50 Torr and at about one atmosphere.

4. The method of claim 2 wherein the residue is exposed to ultraviolet radiation by blanketing the residue with ultraviolet radiation.

5. The method of claim 4 wherein the gas and/or vapor is selected from the group of ammonia, hydrogen and sulfur dioxide.

6. The method of claim 1 wherein the gas and/or vapor includes at least one member selected from the group consisting of ammonia, hydrogen and sulfur dioxide.

* * * * *